US008363445B2

(12) United States Patent
Hui et al.

(10) Patent No.: US 8,363,445 B2
(45) Date of Patent: Jan. 29, 2013

(54) ONE-TIME PROGRAMMABLE MEMORY CELL

(75) Inventors: Frank Hui, San Jose, CA (US); Xiangdong Chen, Irvine, CA (US); Wei Xia, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/283,267

(22) Filed: Oct. 27, 2011

(65) Prior Publication Data

US 2012/0039108 A1 Feb. 16, 2012

Related U.S. Application Data

(62) Division of application No. 12/462,732, filed on Aug. 7, 2009, now Pat. No. 8,050,076.

(51) Int. Cl.
*G11C 17/00* (2006.01)

(52) U.S. Cl. .......................... 365/104; 365/94; 365/105

(58) Field of Classification Search ............. 365/94–105
See application file for complete search history.

(56) References Cited

U.S. PATENT DOCUMENTS 7,593,248 B2 * 9/2009 Xu et al. ........................ 365/96
7,626,845 B2 * 12/2009 Holder et al. .................. 365/96

* cited by examiner

*Primary Examiner* — Kretelia Graham
(74) *Attorney, Agent, or Firm* — Farjami & Farjami LLP

(57) ABSTRACT

According to one exemplary embodiment, a one-time programmable memory cell includes an access transistor coupled to a shiftable threshold voltage transistor between a bitline and a ground, where the access transistor has a gate coupled to a wordline. The shiftable threshold voltage transistor has a drain and a gate shorted together. A programming operation causes a permanent shift in a threshold voltage of the shiftable threshold voltage transistor to occur in response to a programming voltage on the bitline and the wordline. In one embodiment, the access transistor is an NFET while the shiftable threshold voltage transistor is a PFET. In another embodiment, the access transistor is an NFET and the shiftable threshold voltage transistor is also an NFET. The programming voltage can cause an absolute value of the threshold voltage to permanently increase by at least 50.0 millivolts.

20 Claims, 4 Drawing Sheets

300
302
309
312
306
310
314
316
318
308
304

ONE-TIME PROGRAMMABLE MEMORY CELL

This is a divisional of application Serial No. 12/462,732 filed Aug. 07, 2009now U.S. Pat. No. 8,050,076.

BACKGROUND OF THE INVENTION

1. Field of the Invention

The present invention is generally in the field of semiconductors. More particularly, the invention is in the field of semiconductor memory cells.

2. Background Art

One-time programmable memory cells, which can be programmed only once, can be generally utilized in any integrated circuit (IC) chip for storing information that is to be retained when the memory cells are no longer supplied with power. For example, one-time programmable memory cells can be utilized for storing information related to device identification, characteristics, and fabrication processes. A one-time programmable memory cell is typically programmed in a programming operation that irreversibly alters the structure of the memory cell.

A conventional one-time programmable memory cell can include a transistor including a gate oxide disposed between a gate and a substrate, which forms a body of the transistor, and a source and a drain, which are situated in the substrate adjacent to the gate. During a programming operation, a programming voltage can be applied to the gate to cause the gate oxide to break down, thereby programming the memory cell by irreversibly changing the gate oxide from an insulator to a conductor. To break down the gate oxide, a programming voltage of at least 6.0 volts can be required, which can, in turn, require a charge pump and associated circuitry. However, the charge pump and the associated circuitry for providing the necessary programming voltage for the conventional one-time programmable memory cell can undesirably increase power consumption, complexity, and cost.

SUMMARY OF THE INVENTION

A one-time programmable memory cell with shiftable threshold voltage transistor is provided. Features, advantages and various embodiments of the present invention are shown in and/or described in connection with at least one of the drawings, as set forth more completely in the claims.

DETAILED DESCRIPTION OF THE INVENTION

The present invention is directed to a one-time programmable memory cell with shiftable threshold voltage transistor. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
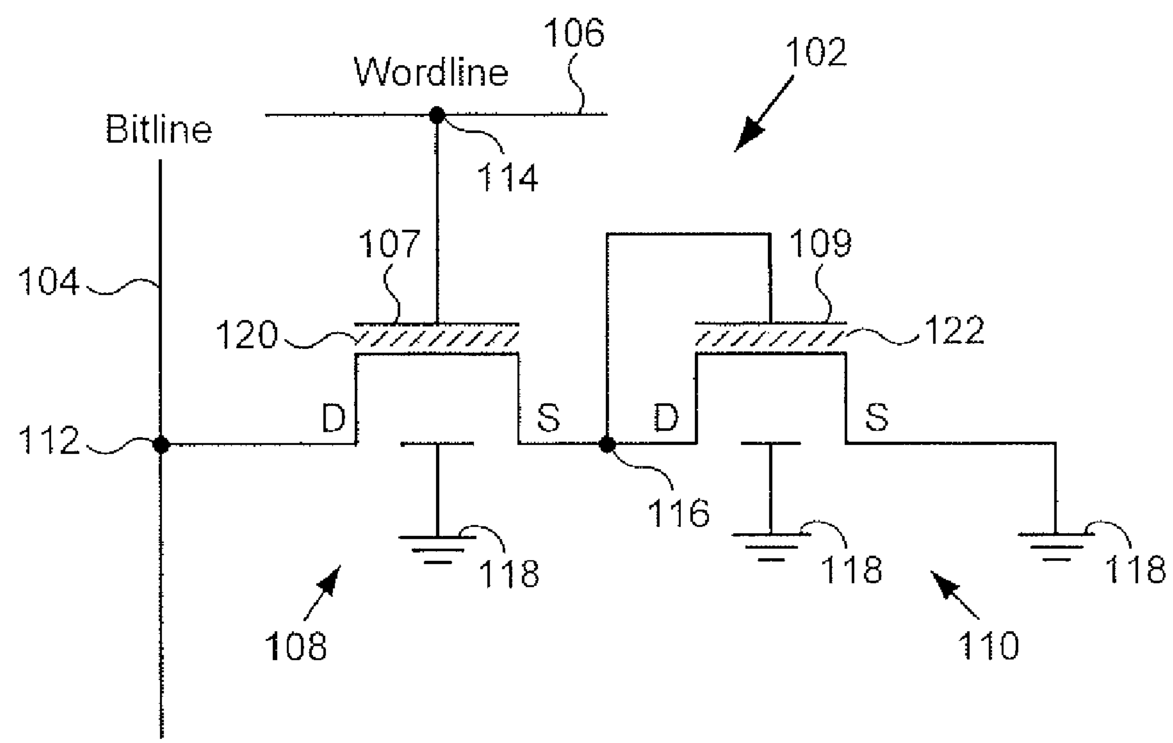
FIG. 1 illustrates a circuit diagram of an exemplary one-time programmable memory cell in accordance with one embodiment of the present invention.

FIG. 1 shows a circuit diagram of an exemplary one-time programmable memory cell in accordance with one embodiment of the present invention. In FIG. 1, one-time programmable memory cell 102 (hereinafter referred to simply as "memory cell 102" in the present application) is coupled to bitline 104 and wordline 106 and includes access transistor 108 and shiftable threshold voltage transistor 110. Memory cell 102 can be generally utilized in any semiconductor die or IC chip for storing information. For example, memory cell 102 can be utilized to store information related to device identification, characteristics, and fabrication processes, and the like. Memory cell 102 can be utilized in a memory array (not shown in FIG. 1), which can include a number of one-time programmable memory cells, such as memory cell 102, as well as a number of bitlines and wordlines, such as bitline 104 and wordline 106. Memory cell 102 can be generally applied to advanced process technologies, such as 45.0 nanometer (nm) process technologies and below.

As shown in FIG. 1, the drain of access transistor 108 is coupled to bitline 104 at node 112, gate 107 of access transistor 108 is coupled to wordline 106 at node 114, and the source of access transistor 108 is coupled to gate 109 and the drain of shiftable threshold voltage (threshold voltage) transistor 110 at node 116. In the embodiment of the invention shown in FIG. 1, access transistor 108 can be an N channel field effect transistor (NFET). In one embodiment of the invention, access transistor 108 can be a P channel FET (PFET). In the embodiment in FIG. 1, shiftable threshold voltage transistor 110 can be a PFET. In one embodiment of the invention, shiftable threshold voltage transistor 110 can be an NFET. Gate 107 can comprise a conductive material such as metal or polycrystalline silicon (polysilicon). Also shown in FIG. 1, the body of access transistor 108 and the body and source of shiftable threshold voltage transistor 110 are coupled to ground 118.

Further shown in FIG. 1, access transistor 108 includes gate dielectric 120, which underlies gate 107 and overlies the channel of access transistor 108. Gate dielectric 120 can comprise, for example, a high dielectric constant (high-k) dielectric material, such as hafnium oxide, hafnium oxynitride, or other hafnium-based high-k dielectric material. In other embodiments, gate dielectric 120 can comprise silicon oxide or other suitable gate insulating material, such as a low dielectric constant (low-k) dielectric material. Also shown in FIG. 1, shiftable threshold voltage transistor 110 includes gate dielectric 122, which underlies gate 109 and overlies the channel of shiftable threshold voltage transistor 110. Gate dielectric 122 can comprise a high-k dielectric material, such as, for example, hafnium oxide, hafnium oxynitride, or other hafnium-based high-k dielectric material. Gate dielectric 122 can have a thickness of, for example, from approximately 10.0 Angstroms to approximately 40.0 Angstroms. Gate 109 can include a metal gate electrode, which can comprise, for example, a metal stack including titanium nitride (TiN) or tantalum nitride (TaN), or other metallic material or metal stack that is suitable for use in a transistor gate. In one embodiment, gate 109 can include a polycrystalline silicon (polysilicon) gate electrode overlying the metal gate electrode.

Memory cell 102 can store a bit of data in shiftable threshold voltage transistor 110 and can have a logic state of “0” or “1”. Memory cell 102 can be programmed in a programming operation by applying a programming voltage to bitline 104 and wordline 106 so as cause a permanent shift (i.e. change) in the threshold voltage of shiftable threshold voltage transistor 110. The programming voltage can be, for example, a high voltage pulse having an amplitude equal to at least approximately 2.0 volts and having a pulse width of at least 1.0 microsecond (μs). During the programming operation, electrical charges (also referred to simply as “charges” in the present application) are trapped in gate dielectric 122 when gate dielectric 122 is stress by a programming voltage, which can be applied to gate 109 and the drain of shiftable threshold voltage transistor 110 at node 116 via access transistor 108. In the embodiment in FIG. 1, wherein shiftable threshold voltage transistor 110 is an NFET, the trapped charges in gate dielectric 122 can be electrons. In an embodiment in which shiftable threshold voltage transistor 110 is a PFET, the trapped charges can be holes. A positive bias temperature instability (PBTI) effect can cause charges to be trapped in gate dielectric 122 when the programming voltage is applied to gate 109 and drain of shiftable threshold voltage transistor 110. In an embodiment in which shiftable threshold voltage transistor 110 is a PFET, a negative BTI (NBTI) effect can causes charge can be trapped in the gate dielectric in response to the programming voltage.

During the programming operation, the threshold voltage of shiftable threshold voltage transistor 110 can be permanently increased by at least 50.0 millivolts (mV) immediately after application of a programming voltage, which can be greater than approximately 2.0 volts, A change in threshold voltage of at least 50.0 mV can be required by sensing circuitry to determine if memory cell 102 has been programmed. For example, the threshold voltage of shiftable threshold voltage transistor 110 can be approximately equal to 300.0 mV before programming and can be equal to approximately 350.0 mV after programming. In an embodiment in which shiftable threshold voltage transistor 110 is a PFET, the threshold voltage can be permanently increased by at least −50.0 mV (i.e. increased by at least 50.0 mV in the negative direction) during programming.

Thus, in a programming operation, the absolute value of the threshold voltage of shiftable threshold voltage transistor 110 can be permanently increased by at least 50.0 mV by applying a programming voltage (e.g. a high voltage pulse) equal to at least approximately 2.0 volts to bitline 104, which is coupled to the drain of access transistor 108, and to wordline 106, which is coupled to gate 107 of access transistor 108. Thus, during the programming operation, a high voltage pulse having an amplitude equal to at least approximately 2.0 volts can be applied to gate 109 and the drain of shiftable threshold voltage transistor 110 at node 116 via access transistor 108, thereby permanently increasing the absolute value of the threshold voltage of shiftable threshold voltage transistor 110 by causing charges to be trapped in gate dielectric 122. The permanent shift in threshold voltage can be increasing by increasing the programming voltage. However, it is desirable to use as low a programming voltage as possible so as to reduce power consumption and manufacturing cost. Thus, an embodiment of the invention’s memory cell 102 can advantageously utilize a programming voltage as low as approximately 2.0 volts. As a result of the permanent increase in threshold voltage caused by the programming voltage, a lower current will flow through shiftable threshold voltage transistor 110 compared to the current flowing through the transistor prior to programming.

In an embodiment of the invention, there can be a difference of at least 10.0 microamperes (μA) in a saturated drain current (Idsat) of shiftable threshold voltage transistor 110 between programmed and unprogrammed states of memory cell 102. Idsat can be defined by the equation:

$$Idsat=C\cdot(Va-Vt)^2 \qquad \text{equation (1)}$$

where “C” is a constant, “Va” is the voltage at node 116, and “Vt” is the threshold voltage of shiftable threshold voltage transistor 110. Thus, as shown in equation (1), the Idsat of shiftable threshold voltage transistor 110 will be lower after programming than before programming as a result of an increase in the absolute value of the threshold voltage. The higher drain current of shiftable threshold voltage transistor 110 prior to programming can be utilized to define a logic “0” state of memory cell 102 and the lower drain current of shiftable threshold voltage transistor 110 after programming can be utilized to define a logic “1” state of memory cell 102, or vice versa.

To perform a read operation on memory cell 102, a supply voltage (i.e. Vdd) can be applied to bitline 104 and wordline 106. The supply voltage can be equal to, for example, approximately 0.85 volts in an embodiment of the invention. In one embodiment, the supply voltage can be equal to approximately 1.0 volt. In another embodiment, the supply voltage can be equal to approximately 1.1 volts. During the read operation, memory cell 102 can be sensed, for example, by sensing the current flowing through the memory cell, i.e., sensing the current flowing from bitline 104 to ground 118. A comparator and/or a sense amplifier can be utilized to determine if memory cell 102 has been programmed. If memory cell 102 has been programmed, for example, a low sensing current corresponding to a permanent increase in the absolute value of the threshold voltage of shiftable threshold voltage transistor 110 can be detected on bitline 104 during the read operation.

By utilizing shiftable threshold voltage transistor 110, an embodiment of the invention’s memory cell 102 can achieve a low programming voltage. The threshold voltage of shiftable threshold voltage transistor 110 can be permanently shifted by at least 50.0 mV during a programming operation by utilizing a programming voltage as low as approximately 2.0 volts. As a result, an embodiment of the invention’s memory cell 102 can require a lower programming voltage compared to a conventional one-time programmable memory cell that is programmed via gate oxide breakdown. Also, the conventional one-time programmable memory cell can require a charge pump and associated circuitry, which undesirably increases power consumption. In contrast, an embodiment of the invention’s memory cell 102 can be advantageously programmed without requiring a charge pump and associated circuitry, thereby advantageously reducing power consumption compared to the conventional one-time programmable memory cell.

Additionally, an embodiment of the invention’s memory cell 102 can be formed in a high-k metal gate process for advanced process technologies, such as, for example, 28.0 nm and smaller process technologies, without requiring an additional mask, thereby advantageously reducing processing cost.

Figure 2:
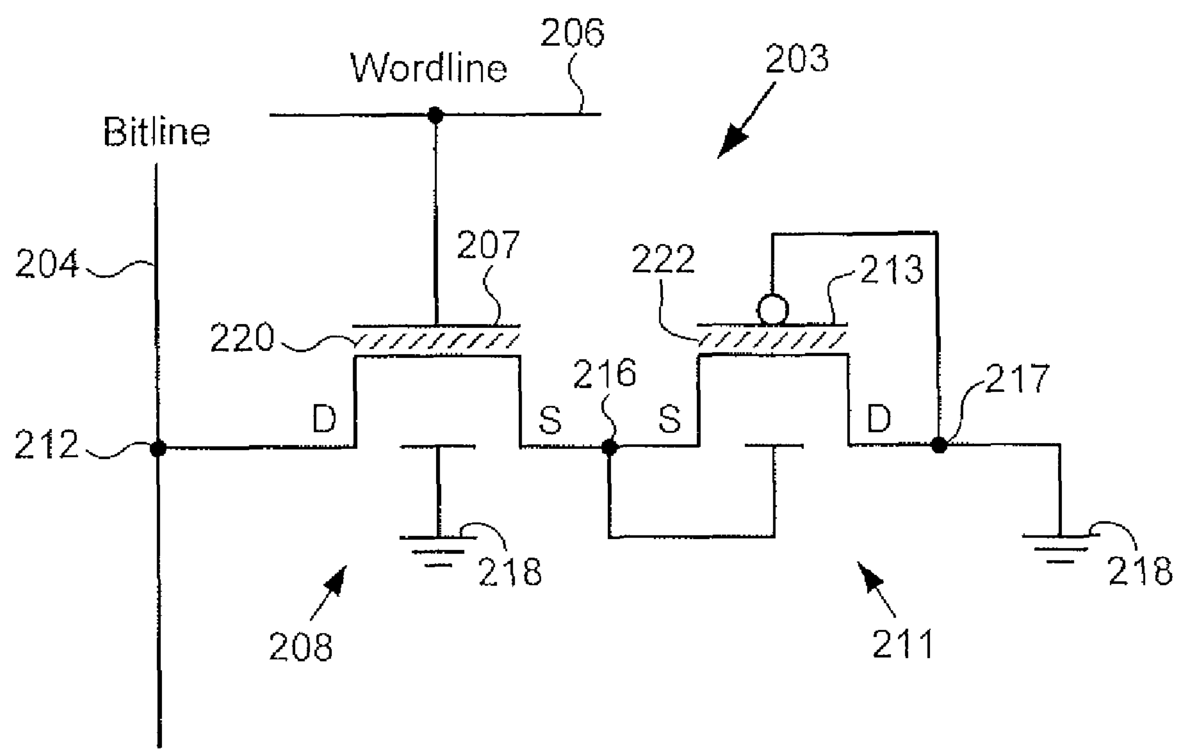
FIG. 2 illustrates a circuit diagram of an exemplary one-time programmable memory cell in accordance with another embodiment of the present invention.

FIG. 2 shows a circuit diagram of an exemplary one-time programmable memory cell in accordance with another embodiment of the present invention. In FIG. 2, one-time programmable memory cell 203 (hereinafter referred to simply as "memory cell 203" in the present application) is coupled to bitline 204 and wordline 206 and includes access transistor 208 and shiftable threshold voltage transistor 211. In FIG. 2, bitline 204, wordline 206, gate 207, access transistor 208, ground 218 and gate dielectrics 220 and 222 correspond, respectively, to bitline 104, wordline 106, gate 107, access transistor 108, ground 118 and gate dielectrics 120 and 122 in FIG. 1. In contrast to shiftable threshold voltage transistor 110 in memory cell 102 in FIG. 1, shiftable threshold voltage transistor 211 is a PFET. Thus, gate 213 of shiftable threshold voltage transistor 211 will comprise a different conductivity dopant than gate 109 of shiftable threshold voltage transistor 110 in memory cell 102.

As shown in FIG. 2, the source of access transistor 208 is coupled to the source and body of shiftable threshold voltage transistor 211 at node 216 and the drain and gate of shiftable threshold voltage transistor 211 are coupled to ground 218 at node 217. In memory cell 203, a substantially similar programming voltage as discussed above for memory cell 102 can be applied to bitline 204 and wordline 206 to cause a permanent shift in the threshold voltage of shiftable threshold voltage transistor 211. For example, a programming voltage of at least approximately 2.0 volts applied to memory cell 203 in a programming operation can cause a permanent increase of at least 50.0 mV in the absolute value of the threshold voltage of shiftable threshold voltage transistor 211. The programming voltage, which can comprise a high voltage pulse having an amplitude of, for example, approximately 2.0 volts or higher, can be applied to the source and body of shiftable threshold voltage transistor 211 at node 216 via access transistor 208.

Although having a different conductivity, gate 213 of shiftable threshold voltage transistor 211 can comprise similar materials as gate 109 of shiftable threshold voltage transistor 110 in FIG. 1. In one embodiment, gate 213 can comprise, for example, a polysilicon gate electrode overlying a metal gate electrode. In another embodiment, gate 213 can comprise only metal gate electrode. Memory cell 203 can provide similar advantageous as discussed above in relation to memory cell 102.

Figure 3:
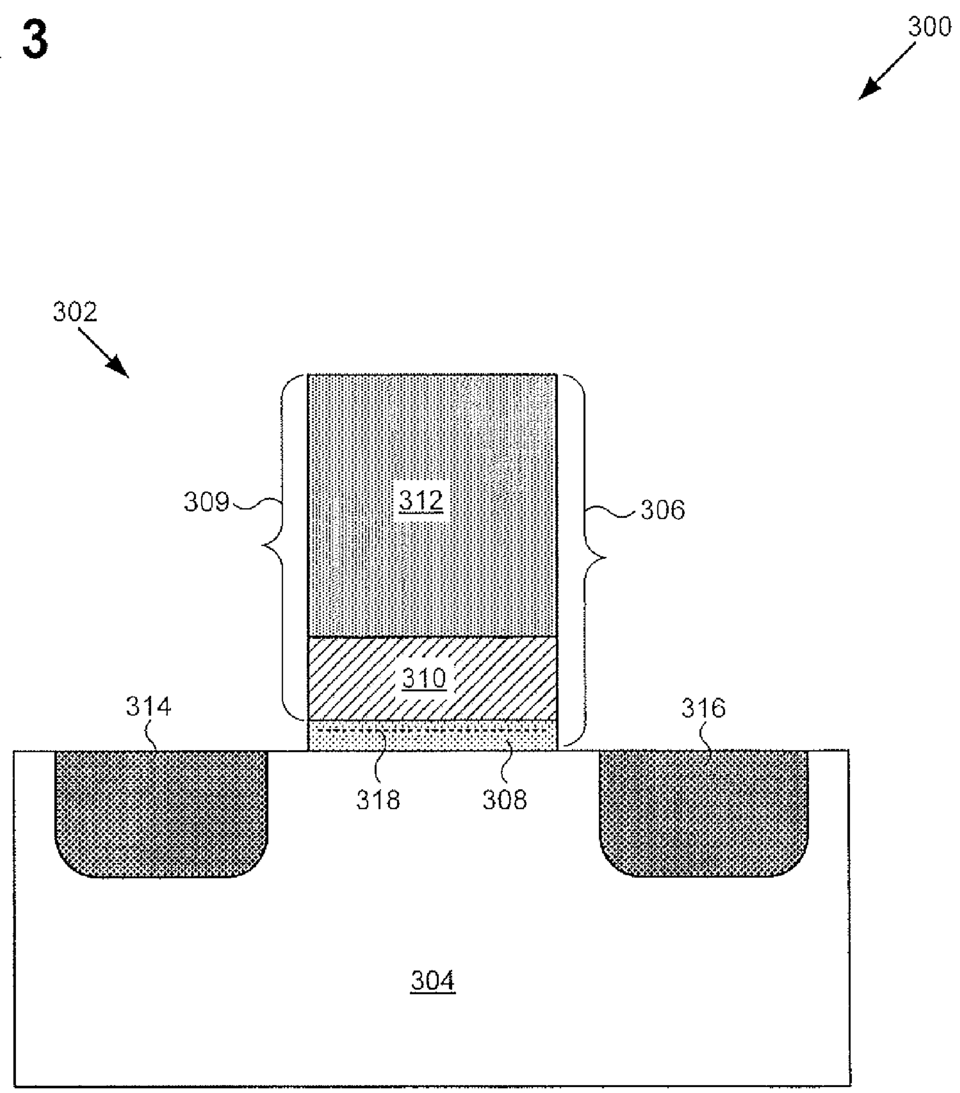
FIG. 3 illustrates a cross-sectional view of an exemplary shiftable threshold voltage transistor for an exemplary one-time programmable memory cell in accordance with one embodiment of the present invention.

FIG. 3 show a cross-sectional view of an exemplary semiconductor structure including an exemplary shiftable threshold voltage transistor in accordance with one embodiment of the present invention. Semiconductor structure 300 includes shiftable threshold voltage transistor 302, which is situated on substrate 304 (e.g. a silicon substrate). Shiftable threshold voltage transistor 302 includes gate stack 306, which includes gate dielectric 308 and gate 309, source 314, and drain 316. Gate 309 includes metal gate electrode 310 and polysilicon gate electrode 312. Shiftable threshold voltage transistor 302 has a structure corresponding to shiftable threshold voltage transistor 110 in memory cell 102 or shiftable threshold voltage transistor 211 in memory cell 203. Shiftable threshold voltage transistor 302 can be an NFET, such as shiftable threshold voltage transistor 110 in memory cell 102. In one embodiment, shiftable threshold voltage transistor 302 can be a HET, such as shiftable threshold voltage transistor 211 in memory cell 203.

As shown in FIG. 3, source 314 and drain 316 are situated in substrate 304 and situated adjacent to opposite sides of gate stack 306 and gate dielectric 308 is situated over substrate 304 and situated between source 314 and drain 316. Gate dielectric 308 corresponds to gate dielectric 122 in shiftable threshold voltage transistor 110 in FIG. 1 and gate dielectric 222 in shiftable Threshold voltage transistor 211 in FIG. 2. Gate dielectric 308 can comprise, for example, a high-k gate dielectric material, such as hafnium oxide, hafnium oxynitride, or other hafnium-based high-k dielectric material. Gate dielectric 308 can have a thickness in a range of, for example, approximately 10.0 Angstroms to approximately 40.0 Angstroms.

Also shown in FIG. 3, metal gate electrode 310 is situated over gate dielectric 308 and polysilicon gate electrode 312 is situated over metal gate electrode 310. Metal gate electrode 310 can comprise, for example, a metal stack including titanium nitride (TiN) or tantalum nitride (TaN), or other metallic material or metal stack that is suitable for use in a transistor gate. Metal gate electrode 310 can have a thickness in a range of, for example, approximately 30.0 Angstroms to approximately 300.0 Angstroms. Polysilicon gate electrode 312 can comprise polysilicon and can have a thickness in a range of, for example, approximately 200.0 Angstroms to approximately 1000.0 Angstroms. In one embodiment, polysilicon gate electrode 312 is not utilized.

Shiftable threshold voltage transistor 302 can be utilized in a one-time programmable memory cell, such as memory cell 102 in FIG. 1, by coupling drain 316 and gate 309 to a source of an access transistor, such as access transistor 108, coupling source 314 and the body (i.e. substrate 304) to ground, coupling the gate of the access transistor to a wordline, such as wordline 106, and coupling the drain of the access transistor to a bitline, such as bitline 104. When a programming voltage is applied to drain 316 and gate 309 of shiftable threshold voltage transistor 302 via the access transistor during a programming operation, charges 318 are trapped in gate dielectric 308, thereby causing a permanent shift in the threshold voltage of shiftable threshold voltage transistor 302. The programming voltage, which can be at least 2.0 volts, can cause an increase of at least approximately 50.0 mV in the absolute value of the threshold voltage, thereby causing the memory cell to be programmed. Charges 318 can be trapped at or close to the interface between metal gate electrode 310 and gate dielectric 308, which can comprise a high-k dielectric material.

In an embodiment in which shiftable threshold voltage transistor 302 is a PFET, shiftable threshold voltage transistor 302 can be utilized in a one-time programmable memory cell, such as memory cell 203 in FIG. 2, by coupling drain 316 and gate 309 to ground, coupling source 314 and the body to the a source of an access transistor, such as access transistor 108, coupling the gate of the access transistor to a wordline, such as wordline 106, and coupling the drain of the access transistor to a bitline, such as bitline 104. When a programming voltage is applied to source 314 and the body of shiftable threshold voltage transistor 302 via the access transistor during a programming operation, charges 318 are trapped in gate dielectric 308 as discussed above, thereby causing a permanent shift in the threshold voltage of shiftable threshold voltage transistor 302.

Figure 4:
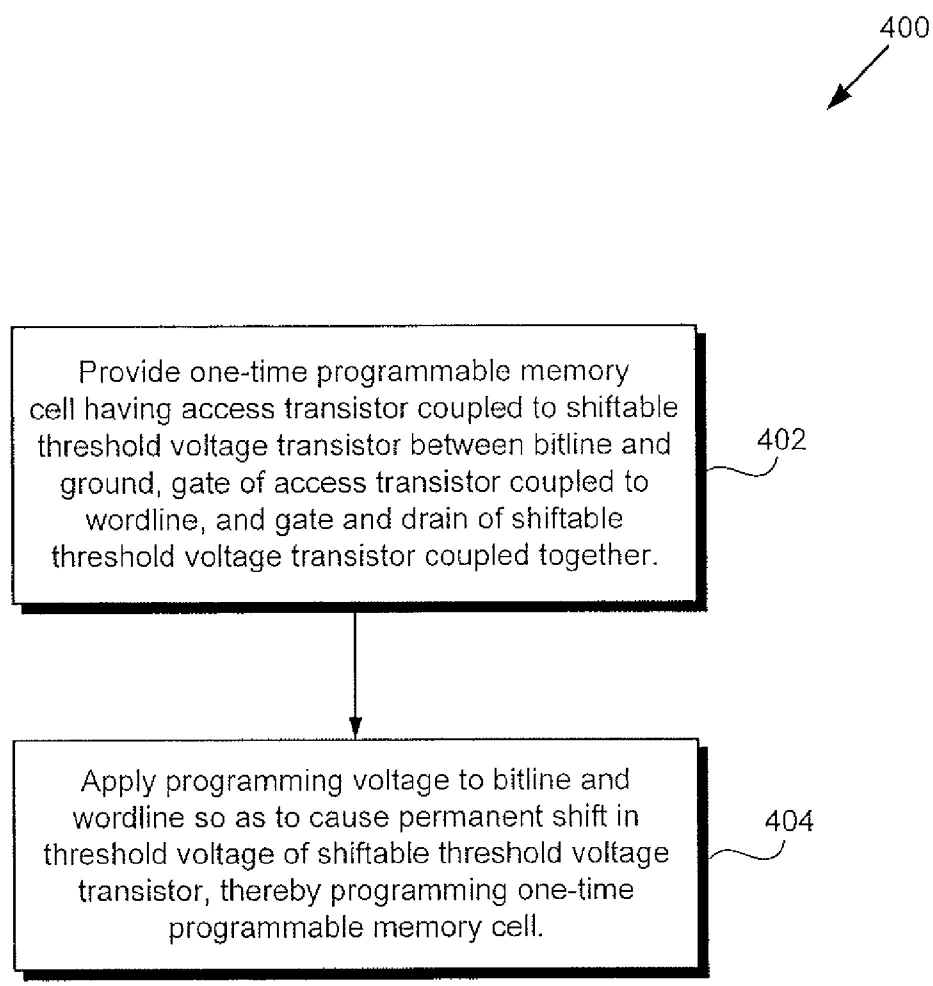
FIG. 4 shows a flowchart illustrating an exemplary method for programming an exemplary one-time programmable memory cell in accordance with one embodiment of the present invention.

FIG. 4 shows a flowchart illustrating an exemplary method for programming a one-time programmable memory cell according to one embodiment of the present invention. Certain details and features have been left out of flowchart 400 that are apparent to a person of ordinary skill in the art. For example, a step may consist of one or more substeps or may involve specialized equipment, as known in the art.

At step 402 of flowchart 400, a one-time programmable memory cell (e.g. memory cell 102 in FIG. 1) can be provided having an access transistor (e.g. access transistor 108) coupled to a shiftable threshold voltage transistor (e.g. shiftable threshold voltage transistor 110) between a bitline (e.g. bitline 104) and ground (e.g. ground 118), the gate of the access transistor coupled to the wordline, the drain and gate of the shiftable threshold voltage transistor coupled together, and the source of the shiftable threshold voltage transistor coupled to ground. In the embodiment in FIG. 1, access transistor 108 can be an NFET and shiftable threshold voltage transistor 110 can be an NFET. In the embodiment in FIG. 2, access transistor 208, which can be an NFET, can be coupled to shiftable threshold voltage transistor 211, which can be a PFET, between bitline 204 and ground 218, the source and body of the shiftable threshold voltage transistor can be coupled to the source of the access transistor, and the gate and drain of the shiftable threshold voltage transistor can be coupled to ground 218 at node 217.

At step 404 of flowchart 400, a programming voltage can be applied to the bitline (e.g. bitline 104) and the wordline (e.g. wordline 106) so as to cause a permanent shift in the threshold voltage of the shiftable threshold voltage transistor (e.g. shiftable threshold voltage transistor 110), thereby programming the one-time programmable memory cell (e.g. memory cell 102). The programming voltage that is applied at node 116 can cause a permanent increase of at least approximately 50.0 mV in the absolute value of the threshold voltage of the shiftable threshold voltage transistor. In an embodiment of the invention, the programming voltage can be approximately 2.0 volts or higher.

Thus, as discussed above, the present invention provides a one-time programmable memory cell including an access transistor coupled to a shiftable threshold voltage transistor. The invention's one-time programmable memory cell can be programmed by applying a programming voltage to the shiftable threshold voltage transistor so as to cause a permanent shift in the shiftable threshold voltage transistor's threshold voltage. As a result, an embodiment of the invention's one-time programmable memory cell can require a lower programming voltage compared to a conventional one-time programmable memory cell that is programmed by other techniques, such as by gate oxide breakdown.

Also, the conventional one-time programmable memory cell can require a charge pump and associated circuitry to provide the necessary programming voltage. In contrast, an embodiment of the invention's one-time programmable memory cell can be programmed without requiring a charge pump and associated circuitry, thereby advantageously reducing power consumption, complexity, and cost compared to the conventional one-time programmable memory cell.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A one-time programmable memory cell comprising:

an access transistor coupled to a bitline, said access transistor having a gate coupled to a wordline;

a shiftable threshold voltage P channel field effect transistor (PFET) coupled between said access transistor and a ground, said shiftable threshold voltage P channel field effect transistor (PFET) having a drain and a gate shorted together;

wherein a shift in a threshold voltage of said shiftable threshold voltage P channel field effect transistor (PFET) occurs in response to a programming voltage on said bitline and said wordline.

2. The one-time programmable memory cell of claim 1, wherein said shiftable threshold voltage P channel field effect transistor (PFET) has a source and a body coupled to said access transistor.

3. The one-time programmable memory cell of claim 1, wherein a permanent shift in said threshold voltage of said shiftable threshold voltage P channel field effect transistor (PFET) occurs in response to said programming voltage on said bitline and said wordline.

4. The one-time programmable memory cell of claim 1, wherein said shiftable threshold voltage P channel field effect transistor (PFET) comprises a high-k gate dielectric underlying a metal gate electrode.

5. The one-time programmable memory cell of claim 4, wherein said shiftable threshold voltage P channel field effect transistor (PFET) further comprises a polysilicon gate electrode overlying said metal gate electrode.

6. The one-time programmable memory cell of claim 1, wherein said programming voltage causes an absolute value of said threshold voltage to increase by at least 50.0 millivolts.

7. The one-time programmable memory cell of claim 1, wherein said programming voltage causes an absolute value of said threshold voltage to permanently increase by at least 50.0 millivolts.

8. The one-time programmable memory cell of claim 1, wherein said programming voltage is equal to at least approximately 2.0 volts.

9. The one-time programmable memory cell of claim 1, wherein said access transistor is an N channel field effect transistor (NFET) having a drain coupled to said bitline and a source coupled to said shiftable threshold voltage P channel field effect transistor (PFET).

10. A method for programming a one-time programmable memory cell, said one-time programmable memory cell comprising an access transistor coupled to a bitline, said access transistor having a gate coupled to a wordline, a shiftable threshold voltage P channel field effect transistor (PFET) coupled between said access transistor and a ground, said shiftable threshold voltage P channel field effect transistor (PFET) having a drain and a gate shorted together, said method comprising:

applying a programming voltage to said bitline and said wordline so as to cause a permanent shift in a threshold voltage of said shiftable threshold voltage P channel field effect transistor (PFET).

11. The method of claim 10, wherein said access transistor is an N channel field effect transistor (NFET) having a drain coupled to said bitline and a source coupled to said shiftable threshold voltage P channel field effect transistor (PFET).

12. The method of claim 10, wherein said shiftable threshold voltage P channel field effect transistor (PFET) comprises a high-k gate dielectric.

13. The method of claim 10, wherein said programming voltage causes an absolute value of said threshold voltage to permanently increase by at least 50.0 millivolts.

14. The method of claim 10, wherein said programming voltage is equal to at least approximately 2.0 volts.

15. A one-time programmable memory cell comprising:

an N channel field effect transistor (NFET) access transistor and a shiftable threshold voltage P channel field effect transistor (PFET) coupled between a bitline and a ground, said access transistor having a gate coupled to a wordline, a drain coupled to said bitline, and a source coupled to said shiftable threshold voltage P channel field effect transistor (PFET);

said shiftable threshold voltage P channel field effect transistor (PFET) having a drain and a gate shorted together, wherein a programming operation causes a shift in a threshold voltage of said shiftable threshold voltage P channel field effect transistor (PFET) in response to a programming voltage on said bitline and said wordline.

16. The one-time programmable memory cell of claim 15, wherein a source and a body of said shiftable threshold voltage P channel field effect transistor (PFET) are coupled to said source of said N channel field effect transistor (NFET) access transistor.

17. The one-time programmable memory cell of claim 15, wherein said shiftable threshold voltage P channel field effect transistor (PFET) comprises a high-k gate dielectric.

18. The one-time programmable memory cell of claim 15, wherein said programming voltage causes an absolute value of said threshold voltage to increase by at least 50.0 millivolts.

19. The one-time programmable memory cell of claim 15, wherein said programming voltage causes an absolute value of said threshold voltage to permanently increase by at least 50.0 millivolts.

20. The one-time programmable memory cell of claim 15, wherein said programming voltage is equal to at least approximately 2.0 volts.

* * * * *